United States Patent [19]

Suzuki

[11] Patent Number: 5,889,324

[45] Date of Patent: Mar. 30, 1999

[54] PACKAGE FOR A SEMICONDUCTOR DEVICE

[75] Inventor: Katsunobu Suzuki, Tokyo, Japan

[73] Assignee: NEC Corporation, Tokyo, Japan

[21] Appl. No.: 50,098

[22] Filed: Mar. 30, 1998

[51] Int. Cl.$^6$ ................................................. H01L 23/495
[52] U.S. Cl. ........................................... 257/712; 257/675
[58] Field of Search .................................... 257/675, 712, 257/717, 678

[56] References Cited

U.S. PATENT DOCUMENTS

| | | | |
|---|---|---|---|
| 4,835,598 | 5/1989 | Higuchi et al. | 257/675 |
| 5,541,450 | 7/1996 | Jones et al. | 257/777 |
| 5,641,987 | 6/1997 | Lee | 257/675 |
| 5,708,567 | 1/1998 | Shim et al. | 257/675 |

Primary Examiner—Donald L. Monin, Jr.
Assistant Examiner—Nathan K. Kelley
Attorney, Agent, or Firm—Young & Thompson

[57] ABSTRACT

A package for a semiconductor substrate capable of being fabricated with a desirable heat radiation capability. The package includes a laminate metal substrate consisting of a metal plate, an insulator provided on the metal plate, and copper foil provided on the insulator. The metal plate is patterned to form heat spreaders/ground planes and a plurality of solitary land patterns electrically insulated from each other. The copper foil forms wings and an island pattern. The wirings and island pattern are respectively electrically connected to the land patterns and heat spreaders/ground planes by via holes and heat radiation via holes. When the island pattern is provided with ground potential, the heat spreaders/ground planes are also provided with ground potential. At the same time, the heat spreaders/ground planes efficiently release heat output from the rear of an LSI (Large Scaled Integrated Circuit) to the outside of the package.

7 Claims, 4 Drawing Sheets

PACKAGE FOR A SEMICONDUCTOR DEVICE

BACKGROUND OF THE INVENTION

The present invention relates to package for a semiconductor device and, more particularly, to a package for a semiconductor device and including a metal substrate.

A package for a semiconductor device called BGA packages are taught in, e.g., Japanese Patent Application No. 7-127395 (Proir Art 1 hereinafter), "ELECTRONIC NEWS", Monday Mar. 6, 1995 (Prior Art 2 hereinafter), and "OVER MOLDED PAD ARRAY CARRIER (OMPACK)", presented by Jim Sloan et al at The FIRST VLSI PACKAGING WORKSHOP, Nov.–Dec., 1992 (Prior Art 3 hereinafter). However, Prior Arts 1–3 each has some problems left unsolved, as follows.

Prior Art 1 lowers productivity because it removes an insulator and copper foil over a broad area for mounting an LSI (Large Scale Integrated Circuit). Specifically, via holes and a cavity each have a large size which lowers process stability, i.e., etching accuracy. In addition, because the LSI is directly mounted to a copper plate wia a mounting material, a stress occurs between the LSI and the copper plate due to a difference in thermal expansion.

Prior Art 2 positions a silicon chip on the same side as solder bumps. Therefore, an area for forming the solder bumps is available only around the silicon chip, obstructing a multipin arrangement. Prior Art 2 also causes a stress to occur between the silicon chip and a copper plate.

Prior Art 3 includes a heat radiation path extending from the surface of a silicon chip to solder bumps via a front copper foil wiring pattern, metal plating on the walls of heat radiation via holes, and a rear copper foil wiring pattern. However, the heat radiation path is so long, resistance to heat required of the package cannot be reduced beyond a certain limit. Moreover, a substrate is formed of glass epoxy which is extremely low in thermal conductivity and makes it extremely difficult to noticeably reduce resistance to heat.

Technologies relating to the present invention are also taught in, e.g., Japanese Patent Laid-Open Publication No. 61-288495.

SUMMARY OF THE INVENTION

It is therefore an object of the present invention to provide a BGA package for a semiconductor device capable of being fabricated with a high heat radiation capability and reliability by a stable process.

A package for a semiconductor device of the present invention includes a metal plate having a preselected pattern and mainly constituted by copper or aluminum, an insulation layer formed on the metal plate, and metal foil formed on the insulation layer and having a preselected pattern including a wiring pattern. The metal plate includes heat spreaders/ground planes and a plurality of solitary island patterns electrically insulated from each other. The metal foil forms an island pattern including wirings and an area for mounting a semiconductor chip. The preselected pattern of the metal plate, wirings and island pattern are electrically connected together by via holes extending throughout preselected portions of the insulation layer and filled with metal by plating. The metal foil is provided with a plated layer of metal on its surface and covered with an insulator except for a part of the wirings. The heat spreaders/ground planes are provided with an insulator layer on their surfaces.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENT

To better understand the present invention, Prior Arts 1–3 mentioned earlier will be described specifically.

Figure 1:
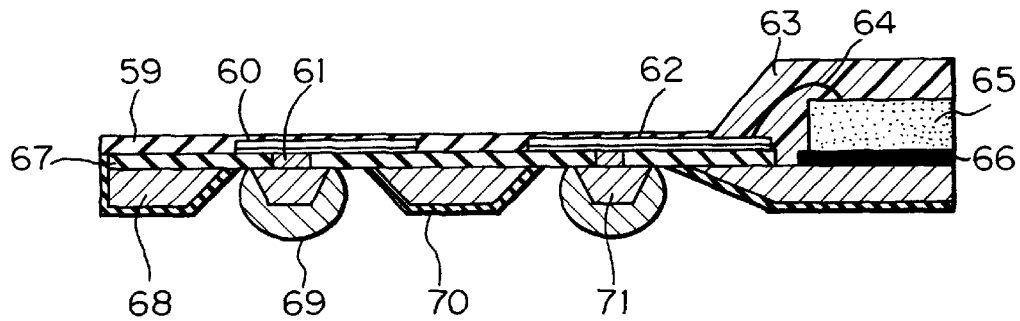
FIG. 1 is a fragmentary section showing a package disclosed in Prior Art 1.
Figure 2:
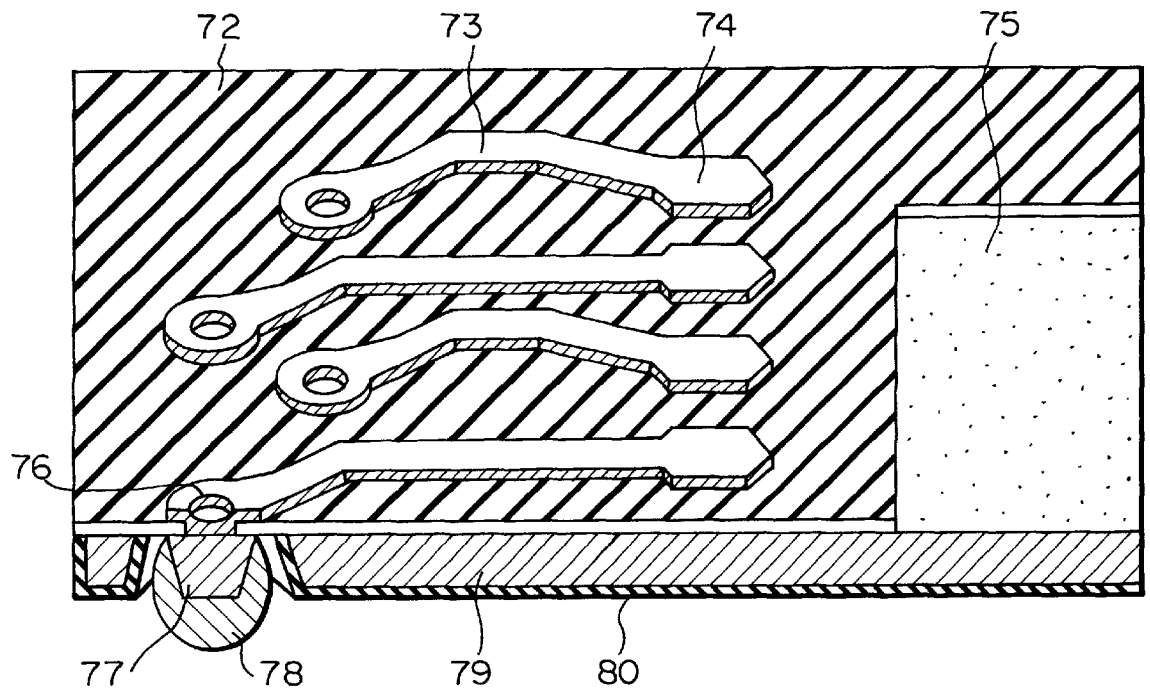
FIG. 2 is a fragmentary perspective view of the package shown in FIG. 1.

FIGS. 1 and 2 show a BGA package for a semiconductor device taught in Prior Art 1. As shown, the package includes a laminate metal substrate consisting of an about 0.15 mm to 0.20 mm thick copper plate, about 40 $\mu$m to 50 $\mu$m insulators 67 and 72 provided on the copper plate, and 18 $\mu$m to 50 $\mu$m thick copper foil provided on the insulators 67 and 72. The copper plate is etched in a preselected pattern by chemical etching. The pattern is made up of a pattern implemented by heat spreader/ground planes 68 and 79, and land patterns 71 and 77 electrically insulated from the planes 68 and 79. The heat spreader/ground planes 68 and 79 serve to radiate heat and intensify ground potential. Solder bumps 69 and 78 are formed on the land patterns 71 and 77, respectively. The copper foil is patterned to form preselected wirings 62 and 73. The wirings 62 and 73 include stitches 74 to be electrically connected to an LSI 65 by bonding wires 64. Via holes 61 and 76 are respectively formed in the wirings 62 and 73 throughout the insulators 67 and 72 in order to provide electrical conduction. The via holes 61 and 76 are filled with metal by plating. In the area for mounting the LSI 65, the insulators 67 and 72 and copper foil are removed in order to form a cavity 75. The LSI 65 is mounted to the cavity 75 with the intermediary of a silver paste or similar mounting material 66. The wirings 62 are connected to the LSI 65 by the bonding wires 64. The LSI 65, bonding wires 64 and their neighborhood are sealed by seal resin 63. The solder bumps 69 and 78 are formed on the land patterns 71 and 77, respectively.

In FIGS. 1 and 2, there are also shown a cover insulator 59, a plated layer 60, and electroformed insulators 70 and 80.

Figure 3:
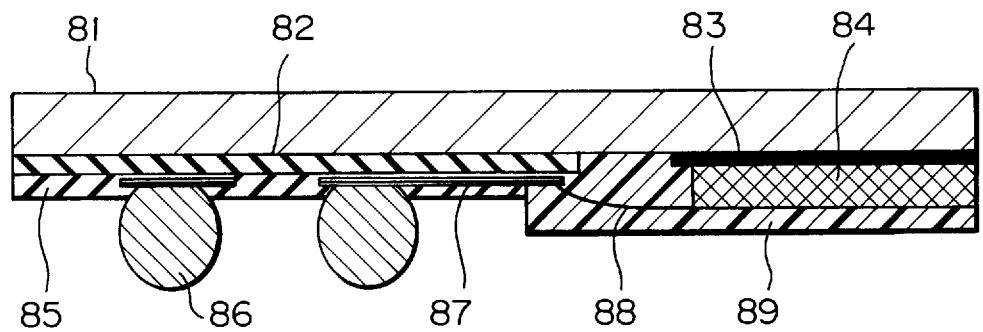
FIG. 3 is a fragmentary section showing a package taught in Prior Art 2.

FIG. 3 shows a BGA package for a semiconductor device disclosed in Prior Art 2. As shown, the package includes a metal plate 81, an insulator 82 provided on the metal plate 81, and a wiring pattern 87 provided on the insulator 82. A cover insulator 85 covers the wiring pattern 87 except for preselected portions of the pattern 87. In the area for mounting a silicon chip 84, the insulator 82 and wiring pattern 87 are removed in order to expose the metal plate 81. The silicon chip 84 is mounted to the exposed metal plate 81 with the intermediary of a silver paste or similar mounting material 83. The electrodes of the silicon chip 84 and the wiring pattern 87 are connected by bonding wires 88. There are also shown in FIG. 3 seal resin 89 sealing the laminate and solder bumps 86.

Figure 4:
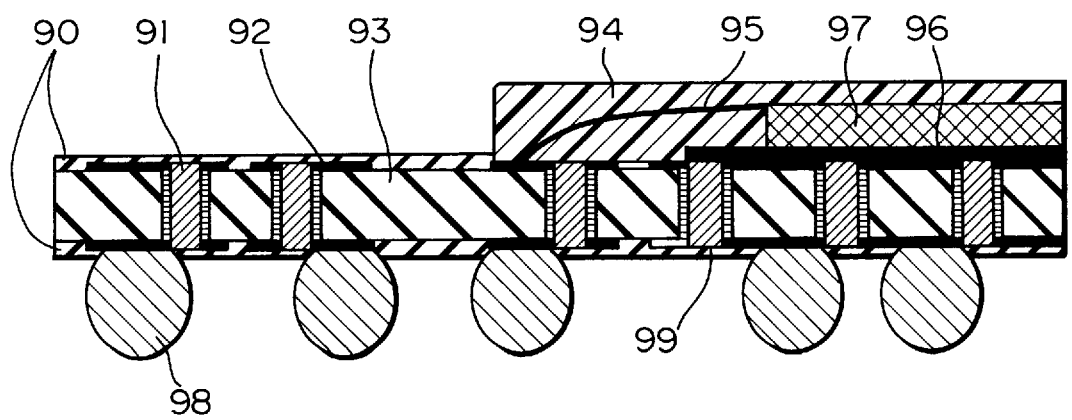
FIG. 4 is a fragmentary perspective view showing a package taught in Prior Art 3.

FIG. 4 shows a BGA package for semiconductor device proposed in Prior Art 3. As shown, preselected wiring patterns 92 are provided on both sides of an insulative substrate 93. Via holes 91 are formed in preselected positions of the substrate 93 in order to provide electrical conduction between the wiring patterns 92 formed on both sides of the substrate 93. The walls of the via holes 91 are plated with metal. Heat radiation via holes 99 are also formed in the substrate 93 in order to radiate heat from the rear of a silicon chip 97. The side walls of the via holes 99 are also plated with metal for enhancing heat conduction. After the silicon chip 97 has been mounted to a silver paste or similar mounting material 96, the electrodes of the chip 97 and the wiring patterns 92 are connected by bonding wires 95. The silicon chip 97, bonding wires 95 and their neighborhood are sealed with epoxy resin or similar seal resin 94. Solder bumps 98 are formed at preselected positions on the rear wiring pattern 92. The solder bumps 98 are used to implement electrical connection to the outside while promoting heat radiation. The reference numeral 90 designates a cover insulator.

Prior Arts 1–3 described above have the previously discussed problems, particularly the insufficient heat radiation problem.

Preferred embodiments of the package for a semiconductor in accordance with the present invention will be described hereinafter.

1st Embodiment

Figure 5:
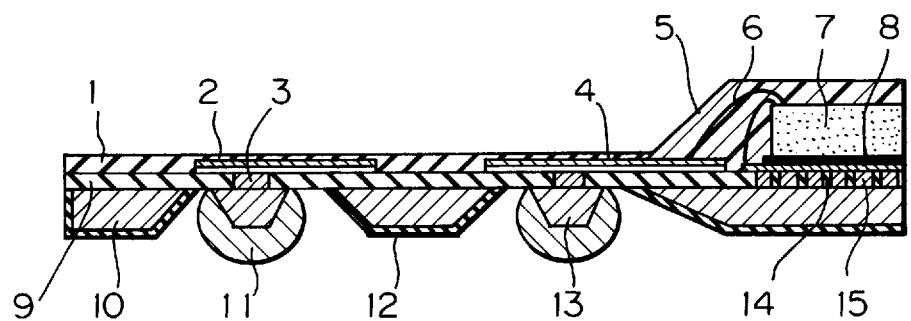
FIG. 5 is a fragmentary section showing a first embodiment of the package in accordance with the present invention.
Figure 6:
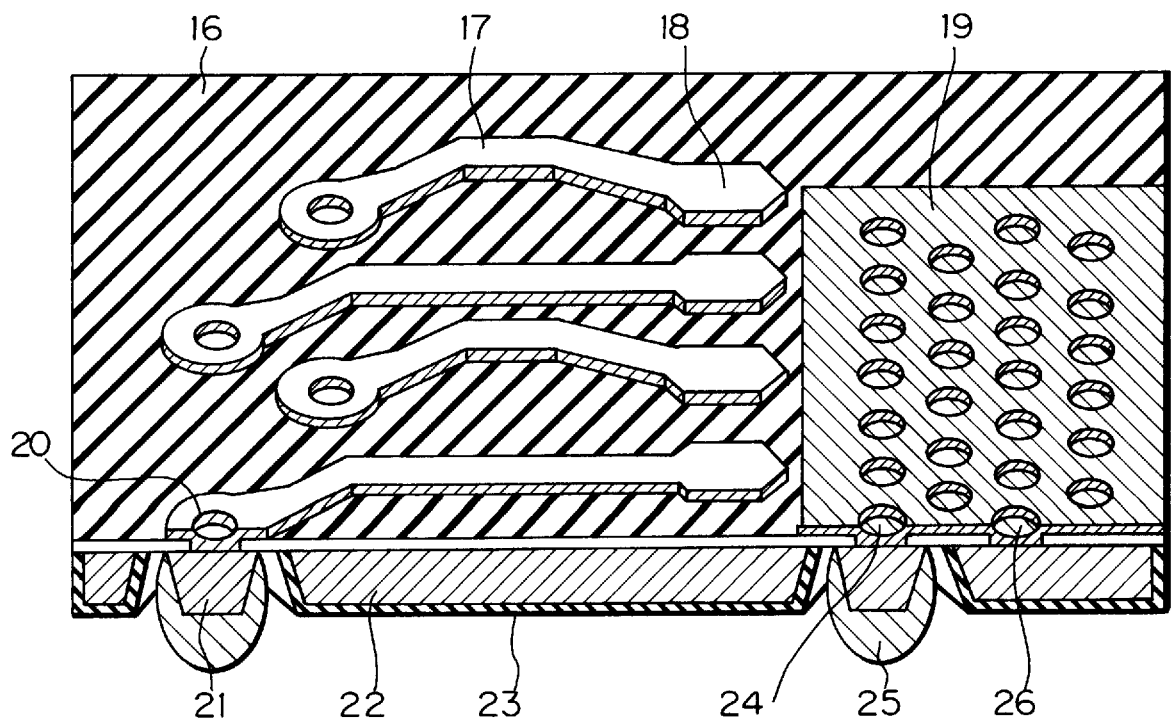
FIG. 6 is a fragmentary perspective view of the first embodiment.

Referring to FIGS. 5 and 6, a BGA package embodying the present invention is shown. FIGS. 5 and 6 respectively show a part of the package forming a semiconductor device and the entire package. As shown, the package includes a laminate metal substrate consisting of an about 0.15 mm to 0.20 mm thick metal plate formed of copper or aluminum, an about 40 $\mu$m to 50 $\mu$m thick insulator, and 18 $\mu$m to 35 $\mu$m thick copper foil. When the metal plate is processed, it turns out a heat spreader/ground plane 10, a heat spreader/ground plane 22, a land pattern 13, and a land pattern 21. The insulator turns out insulators 9 and 16 when processed. Further, the copper foil turns out copper foil wirings 4 and 17 when processed.

Specifically, the metal plate of the substrate is etched to form the heat spreaders/ground planes 10 and 22 and the plurality of solitary land patterns 13 and 21 electrically insulated from each other. The wirings 4 and 17 formed by the copper foil and an island pattern 15 are electrically connected to either the land patterns 13 and 21 or the heat spreaders/ground planes 10 and 22 or to both of them. For this purpose, via holes 3, 20, 24 and 26 are formed in the insulators 9 and 16 and filled with metal by plating. Via holes 14 formed in an island pattern 15 will be referred to as heat radiation via holes for distinction from the other via holes.

The via holes will be described more specifically with reference to FIG. 6. As shown, the via holes 20 electrically connect the wirings 17 and land patter 21. The via holes 24 electrically connect an island pattern 19 and land pattern 21. The via holes 26 provide electrical conduction between the island pattern 19 and the heat spreader/ground plane 22. In this configuration, when the island pattern 19 is provided with ground potential, the land pattern and heat spreader/ground plane connected to the via holes 24 and 26 are also provided with ground potential. Further, the via holes 24 and 26 efficiently transfer heat generated on the rear of an LSI 7 to the beat spreaders/ground planes 22, land pattern 21 and solder bumps 25, so that resistance to heat required of the package can be reduced. The three kinds of via holes 20, 24 and 26 are identical in size and therefore noticeably enhance etching accuracy and process stability.

The wirings 4 and 17 are plated with metal forming a plated layer 2. Subsequently, the laminate is covered with a cover insulator 1 except for the island patterns 15 and 19 and the portions of the wirings 4 and 17 to be used for bonding (bonding stitches 18). The cover insulator 1 is not shown in FIG. 6. Electrodeposited insulators 12 and 23 are provided on the surfaces of the heat spreaders/ground planes 10 and 22, respectively. When solder bumps 11 and 25 are respectively formed on the land patterns 13 and 21, the insulators 12 and 23 prevent the land patterns 13 and 21 from short-circuiting. In addition, the insulators 12 and 23 prevent the adjoining solder bumps from short-circuiting in the event of mounting. In the illustrative embodiment, the LSI 7 is mounted to the island patterns 15 and 19 with the intermediary of a silver paste or similar mounting material 8.

Preselected electrodes of the LSI 7 and the bonding stitches 18 of the wirings 4 or the island patterns 15 and 19 are connected by bonding wires 6. Subsequently, the LSI 7, bonding wires 6, bonding stitches 18 and their neighborhood are sealed with epoxy resin or similar seal resin 5. Finally, the solder bumps 11 and 25 are formed on the land patterns 13 and 21, respectively.

2nd Embodiment

Figure 7:
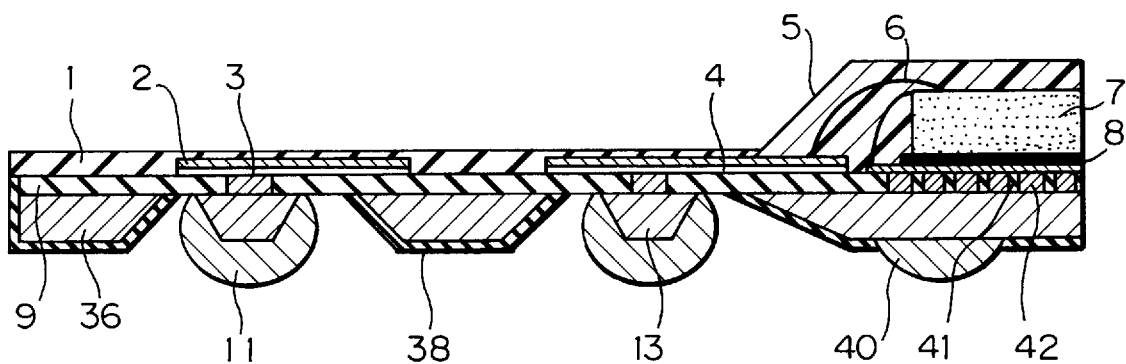
FIG. 7 is a fragmentary section showing a second embodiment of the present invention.

FIG. 7 shows a second embodiment of the present invention. This embodiment is identical with the first embodiment except for the following. As shown, a heat spreader/ground plane 36 is electrically connected to an island pattern 42 by heat radiation via holes 41. An electroformed insulator 38 is provided on the surface of the heat spreader/ground plane 36. The insulator 38 is removed at the rear of the LSI 7 in a preselected pattern so as to expose the metal plate. Heat radiation bumps 40 for heat radiation and ground potential are formed on the exposed portions of the metal plate.

3rd Embodiment

Figure 8:
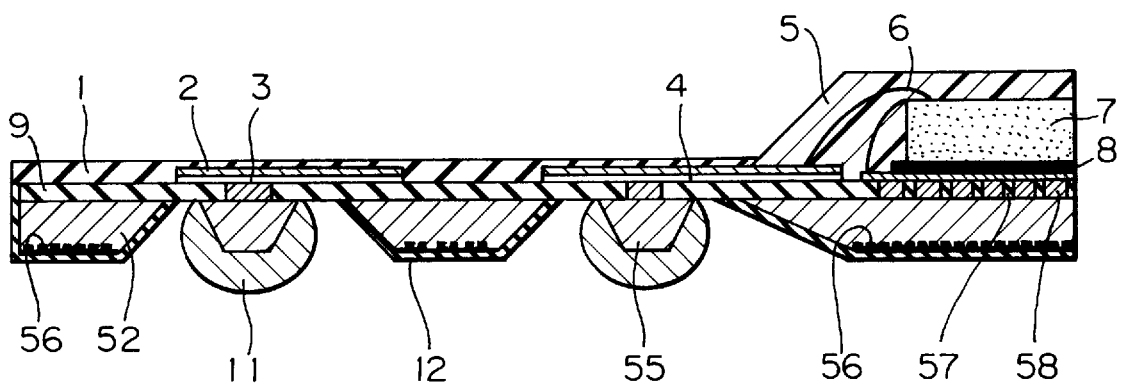
FIG. 8 is a fragmentary section showing a third embodiment of the present invention.

FIG. 8 shows a third embodiment of the present invention. This embodiment is also identical with the first embodiment except for the following. As shown, a heat spreader/ground plane 52 is electrically connected to an island pattern 59 by heat radiation via holes 57. Irregularities 56 are intentionally formed on the surface of the heat spreader/ground plane 52 in order to increase the heat radiation area. This allows resistance to heat to be further reduced. To form the irregularities 56, the metal plate is etched at the same time as the beat spreader/ground plane 52 and a land pattern 55 are formed. A resist pattern for forming the irregularities 56 is provided with an aperture size far smaller than the aperture size of a resist pattern used to form the heat spreader/ground plane 52 and land pattern 55. With this aperture configuration, a microloading effect is achievable.

In summary, in accordance with the present invention, a package for a semiconductor includes a metal plate and metal foil forming an island pattern. The island pattern and metal plate are electrically connected by radiation via holes filled with metal. In this configuration, heat output from the rear of an LSI chip can be released to the metal plate or head radiator over a path as short as several ten microns. A thermal stress between the LSI chip and the metal plate is absorbed by insulators intervening between the island pattern and the metal plate, so that the reliability of the package is insured over a long period of time. Moreover, the insulators are etched in the same or substantially the same size, enhancing etching accuracy and process stability.

What is claimed is:

1. A package for a semiconductor device, comprising:

a metal plate having a preselected pattern;

an insulation layer formed on said metal plate; and a metal foil formed on said insulation layer and having a preselected pattern comprising wirings and an island pattern for mounting a semiconductor chip and for thermally conducting heat from the semiconductor chip;

said metal plate including heat spreaders/ground planes and a plurality of solitary land patterns electrically insulated from each other;

said preselected pattern of said metal plate, said wirings and said island pattern being electrically and thermally connected together by metal filled via holes extending throughout preselected portions of said insulation layer, said holes serving to conduct heat from said island pattern and the semiconductor chip to said metal plate;

said metal foil being provided with a plated layer of metal on a surface thereof and covered with an insulator except for a part of said wirings, said heat spreaders/ground planes being provided with an insulator layer on surfaces thereof.

2. A package as claimed in claim 1, wherein said insulator layer provided on said heat spreaders/ground planes connected to said island pattern by said via holes is removed at a plurality of portions thereof.

3. A package as claimed in claim 2, wherein solder bumps are formed on portions of said metal plate exposed by removal of said insulator layer.

4. A package as claimed in claim 1, wherein said heat spreaders/ground planes each has a fine irregular surface.

5. A package as claimed in claim 4, further comprising a semiconductor chip mounted to said island pattern with an intermediary selected from one of an organic resin, a metal-containing resin and a metal having a low melting point, preselected electrodes of said semiconductor chip and bonding stitches provided at ends of said wirings or said island pattern electrically connected by bonding wires, said semiconductor chip, said bonding wires and a neighborhood thereof being sealed with an organic seal resin, and solder bumps formed on said land patterns.

6. The package of claim 1, wherein said island pattern comprises holes.

7. The package of claim 2, where solder bumps are formed on portions of said heat spreader/ground planes.

* * * * *